United States Patent [19]

Derewonko et al.

[11] Patent Number: 4,872,049
[45] Date of Patent: Oct. 3, 1989

[54] ENCAPSULATED LOW-NOISE ULTRA-HIGH FREQUENCY SEMICONDUCTOR DEVICE

[75] Inventors: Henri Derewonko, Voisins le Bretonneux; Didier Adam, Gif sur Yvette; Daniel Delagebeaudeuf, Saclay; Patrick Resneau, Boulogne, all of France

[73] Assignee: Thomson Hybrides et Microondes, Paris, France

[21] Appl. No.: 133,421

[22] Filed: Dec. 15, 1987

[30] Foreign Application Priority Data

Dec. 16, 1986 [FR] France .................. 86 17564

[51] Int. Cl.$^4$ ............................................. H01L 23/48
[52] U.S. Cl. ........................................ 357/68; 357/65; 357/74
[58] Field of Search ............... 357/68, 41, 65, 51, 357/74

[56] References Cited

FOREIGN PATENT DOCUMENTS

| | | |
|---|---|---|
| 0174457 | 3/1986 | European Pat. Off. . |
| 2231114 | 12/1974 | France . |
| 2507017 | 12/1982 | France . |
| 2529013 | 12/1983 | France . |

OTHER PUBLICATIONS

Patent Abstracts of Japan, vol. 6, No. 47 (E-99) [925], 26 mars 1982, & JP-A-56 162 858 (Nippon Denki K.K.), 15-12-1981.

*Primary Examiner*—Andrew J. James
*Assistant Examiner*—Mark Prenty
*Attorney, Agent, or Firm*—Oblon, Spivak, McClelland, Maier & Neustadt

[57] ABSTRACT

An ultra-high frequency transistor is mounted in a hermetically sealed package in order to be made usable and in order to improve its performance characteristics to the optimum level. To diminish the noise factor of an ultra-high frequency transistor, the geometrical dimensions of the gate must be reduced. But the transistor changes its impedance and maximum frequency and can no longer be used in a package or at the external impedance of the circuit. It has to be pre-matched by having a choke mounted between its gate, its drain and the corresponding external connections. Each choke consists of a long metallic wire, forming a hairpin, soldered inside the package between the gate metallization and the internal end of its external connection or between the drain metallization and the internal end of its external connection. The invention can be applied to low-noise ultra-high frequency amplifiers.

6 Claims, 2 Drawing Sheets

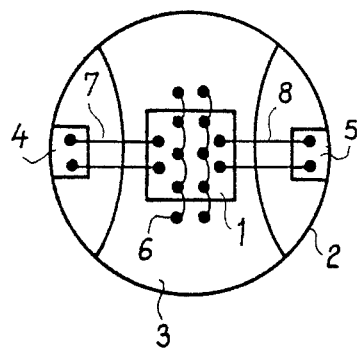
FIG_1 PRIOR ART
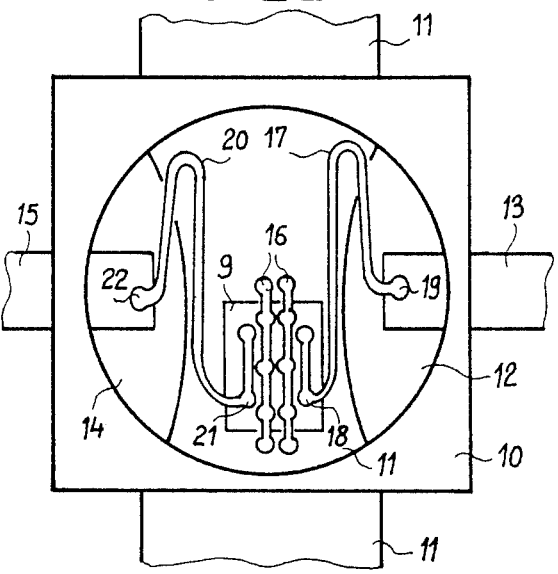
FIG_2
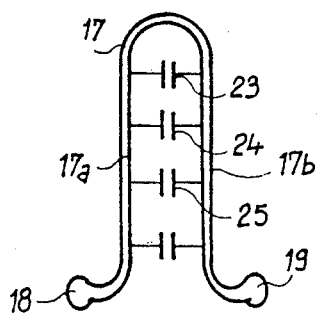
FIG_3
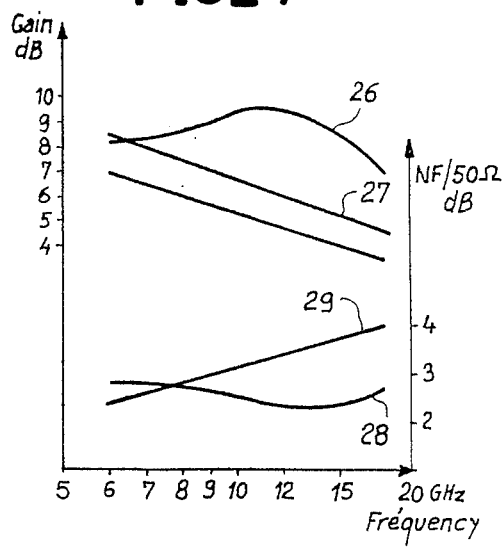
FIG_4
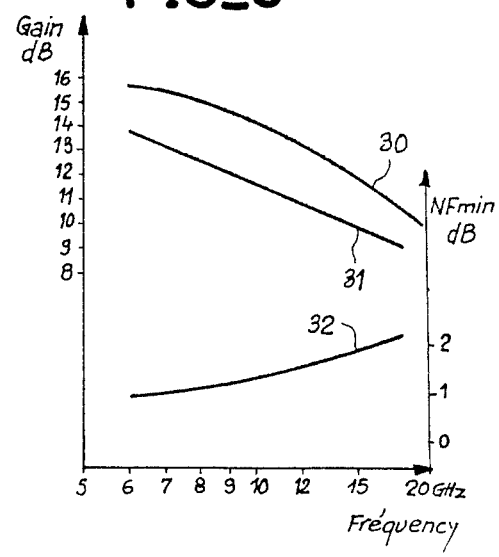
FIG_5

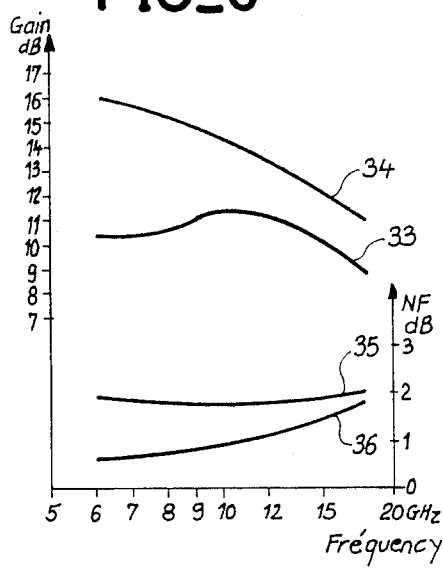
FIG_6
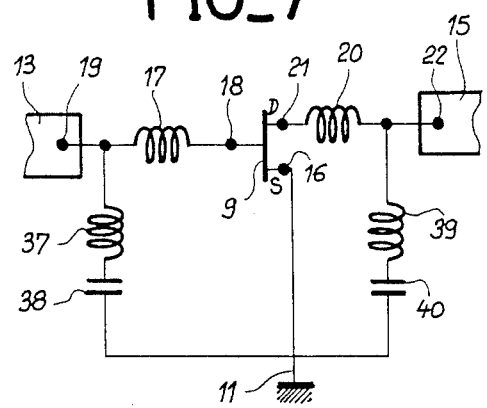
FIG_7
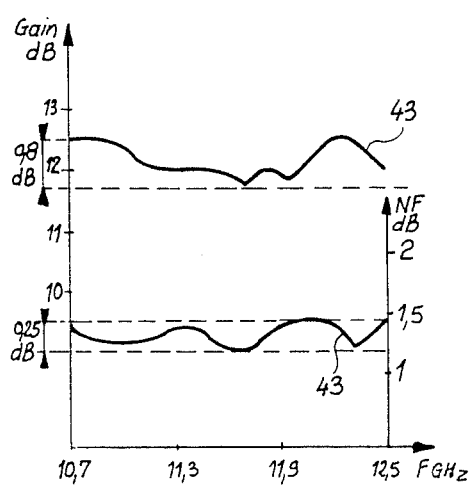
FIG_9
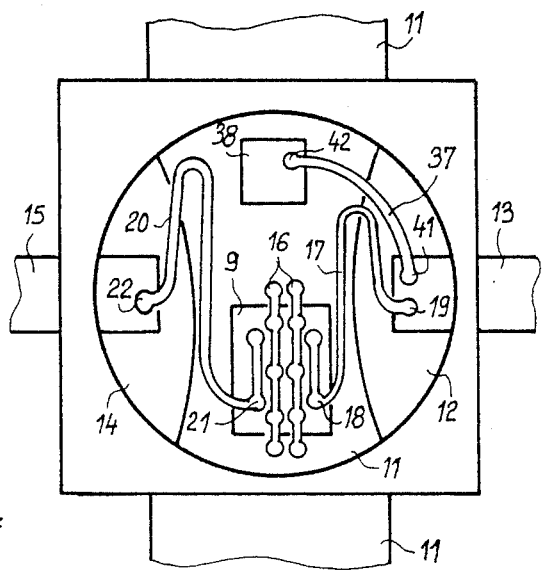
FIG_8

ENCAPSULATED LOW-NOISE ULTRA-HIGH FREQUENCY SEMICONDUCTOR DEVICE

BACKGROUND OF THE INVENTION

1. Field of the Invention

The present invention pertains to a semiconductor device comprising an ultra-high frequency transistor that works as a low-noise amplifier and is encapsulated in a package with an internal cavity. This ultra-high frequency transistor is matched with a standardized external impedance of 50 ohms at input and output. It can therefore be used in a wide range of frequencies without any external impedance-matching circuit: it is pre-matched inside the package: the pre-matching at the terminals of the chip of semiconducting material gives more gain and greater band width than an external matching at the terminals of the package. This pre-matching also gives lower noise factor.

2. Description of the Prior Art

The making of ultra-high frequency amplifiers, in a range of 6 GHz to 100 GHz for example, raises two types of problems. Firstly, in the current state of the art, it is not possible to make a hermetically sealed package that works at more than 25 GHz for low-noise amplifiers. Yet, to be mounted on a satellite, a directional radio link system or military equipment, it is necessary for ultra-high frequency amplifiers to be in a package. Each frequency band has a corresponding package that is matched with an external impedance.

Furthermore, to reduce noise and increase the gain of an ultra-high frequency transistor chip, the dimensions of the gate must be reduced. However, in this case, the optimum frequency of the transistor changes: it goes from the band 6-18 GHz, for example, to the band 18-40 GHz. A chip modified in this way can no longer be used in a package mounted between two 50-ohm lines at 12 GHz.

3. Summary of the Invention

To remove these disadvantages, the present invention proposes the pre-matching of a chip of a low-noise ultra-high frequency transistor directly inside the encapsulating package, the pre-matching circuit being mounted between the metallic terminals of the transistor chip and the internal ends of the external connections of the package. Since the reduction in the dimensions of the gate, made in order to reduce noise, modifies the impedance of the transistor and brings the said impedance closer to that of the open circuit, this impedance modification is corrected by inserting a pre-matching circuit inside the package, the said pre-matching circuit comprising at least one choke between the gate terminal or the drain terminal and the corresponding external connection.

An object of the invention, therefore, is to obtain, through internal pre-matching in the package, an ultra-high frequency transistor with less and more gain, mounted between two 50-ohm lines. Since it is matched, the low-noise amplifier also has more gain and a greater band width.

Another object of the present invention is to be able to encapsulate a low-noise transistor chip, working at 40 GHz for example, in a package that can be used up to 25 GHz, since it is not possible at present to make hermetically sealed packages that work at frequencies of beyond 25 GHz.

According to an improvement of the invention, a second matching circuit is added inside the package in order to approach the minimum noise factor, the said second matching circuit being connected to the internal end of an external connection. This circuit, comprising a choke which is series-connected with a capacitor, improves the gain if it is connected to the drain and decreases the noise if it is connected to the gate.

More precisely, the invention comprises a low-noise, ultra-high frequency semiconductor device comprising a transistor mounted in a package, the said package having an internal cavity and at least two external connections, the transistor chip being soldered to a metallic or metallized base inside the package and being provided with contact terminals on its gate and drain electrodes, the said semiconductor device being pre-matched in impedance by at least one choke which is series-mounted between either the gate electrode or the drain electrode of the transistor and its corresponding external connection, the said choke, inside the package, comprising a metallic wire or microstrip which is fixed between a terminal on the transistor chip and the internal end of an external connection, and which forms a hairpin that has its two strands substantially parallel to each other.

BRIEF DESCRIPTION OF THE DRAWINGS

The invention will be better understood from the following detailed description of an example of an application, made with reference to the appended figures, of which:

FIG. 1 is a top view of an ultra-high frequency transistor chip mounted in a package according to the prior art;

FIG. 2 is a top view of an ultra-high frequency chip mounted in a package according to the invention;

FIG. 3 is a diagram of the pre-matching, variable according to frequency, of a connection wire inside a package, according to the invention;

FIG. 4 shows gain and noise factor curves, according to frequency, for a MESFET-type transistor pre-matched according to the invention;

FIG. 5 shows gain curves associated with the minimum noise factor, according to frequency, for a MESFET-type transistor pre-matched according to the invention;

FIG. 6 shows a gain curve and a curve for the gain associated with the minimum noise factor, according to frequency, in a TEGFET-type heterojunction transistor pre-matched according to the invention;

FIG. 7 is an electrical diagram of an improvement in the invention, that provides matching close to the minimum noise factor;

FIG. 8 is a top view of an ultra-high frequency chip mounted in a package according to the improvement of FIG. 7;

FIG. 9 shows gain curves associated with the minimum noise factor, according to frequency, for a TEGFET transistor according to the improvement in the invention.

DESCRIPTION OF A PREFERRED EMBODIMENT

FIG. 1, which shows a top view of an ultra-high frequency transistor chip mounted in a package, is intended to recall the standards of the prior art. If a chip 1 of an ultra-high frequency transistor has to be mounted in a package symbolized by a circle 2, the chip is generally soldered to a metallic base 3, and its various gate and drain electrodes are connected to the metallic base 3 and to the external connections of the package 4 and 5 by means of wires or metallic microstrips. In FIG. 1, the source of the transistor is connected to the metallic base 3 by microstrips 6, while the gate is connected to the external connection 4 by a microstrip 7 and the drain is connected to the external connection 5 by a microstrip 8. The mounting may be different, but the important point is that it is well known that whenever a transistor chip is mounted, the mounting is done in such a way that the wires or connecting strips 6, 7 and 8 are as short as possible so as to avoid unwanted self-inductances which are automatically created by wire lengths in ultra-high frequency devices.

When it is desired to improve the low-noise performance characteristics of an amplifier working at ultra-high frequencies, between 6 GHz and 40 GHz for example, and when the said amplifier is mounted inside a package with an internal cavity, it is known that the length of the transistor gate must be reduced, for example by 0.5 to 0.3 microns for the gate, in order to reduce the noise: this is because of the shorter transit time of the electrons in the gate region. Consequently, the ultra-high frequency losses are smaller and the gain increases. In the same way, the width of the gates is reduced from 300 to 128 or 64 microns, thus causing the transistor chip, which then has a different configuration, to work at a greater frequency.

But chips modified in this way, by modifying the dimensions of their gates, become unusable in a package mounted on external impedance lines of 50 ohms because of the modification of the s-parameters and the standing wave ratio.

To characterize ultra-high frequency performance characteristics, the reflection s-parameters are used. The parameter $S_{11}$ is the input reflection coefficient with the output connected to an impedance of 50 ohms. The parameter $S_{22}$ is the output reflection coefficient with the input connected to an impedance of 50 ohms. Thus, the transistor chips that normally work between 6 and 18 GHz, modified to have low noise through the reduction of their gates, work at 40 GHz and are no longer suitable for working at 12 GHz in a package mounted on two lines of 50 ohms at input and output.

To make a low-noise amplifier that works at 12 GHz for example (since this is the example chosen to explain the invention) the transistor chip must be pre-matched at the terminal of the chip and inside the package. Thus, an impedance matching makes the encapsulated transistor usable in a freqency band of 6 GHz to 18 GHz.

The pre-matching is done, by means of a series-mounted choke wire, on at least one of the two gate or drain terminals as shown in FIG. 2.

This figure shows the central part of a package with an internal cavity in which an ultra-high frequency transistor chip, pre-matched according to the invention, is encapsulated.

An ultra-high frequency transistor chip 9, for which the gate, source and drain terminals need not be described in detail, is mounted inside a discrete package comprising a ceramic frame 10 fixed to a metallic base 11. The metallic base 11 constitutes a ground inside the package and extends outside it so as to form a package-fixing means as well as an external access connection for the source electrodes. Inside the package, an insulating shoulder 12, made of ceramic for example, supports a first external access connection 13, and symmetrically, a shoulder 14 made of insulating material supports a second external access connection 15. The external access connections 13 and 15 constitute 50-ohm impedance-matched lines.

The source terminal of transistor 9 is connected to the ground 11 by one or more wires or metallic microstrips 16. The number of wires or microstrips and the number of solder spots on the surface of transistor chip transistor 9 depend on the configuration of the transistor and on the reduction in the source inductance.

The electrical connection between the source and the ground is as short as possible to obtain optimum gain. However, since any fraction of a 50-ohm line serving only to cross the space between the inside and the outside of the box as in the prior art device shown in FIG. 1, causes the phase to change and reduces the pass-band of the transistor in the package, it is necessary to eliminate or match these sections of 50-ohm lines, essentially between the gate terminal and the external circuit and between the drain terminal and the external circuit.

It has been stated that by reducing the length and width of the gate, the transistor characteristics are displaced, and, on Smith's chart, where the 50-ohm impedance is at the center of the circle, an open circuit is approached. To pre-match the transistor thus modified to give low noise and high gain, it is therefore necessary to add a series-mounted choke on the gate and/or the drain so as to approach the minimum noise factor for the input and match the output of 50 ohms.

For at least one of the two electrodes (but preferably for both), the internal pre-matching choke of the gate comprises a connecting choke wire 17 which forms a hairpin between the gate terminal 18 on the transistor chip and the end 19 of the internal part of the external connection 13. In the same way, the drain pre-matching choke comprises a choke wire 20 which forms a hairpin between the drain terminal 21 on the transistor chip and the internal end 22 of the external access connection.

It is important that these wires, which are long, contrary to the practice laid down in the field of ultra-high frequencies, should form a hairpin in which two strands of the wire are substantially in the same plane and substantially parallel to each other.

For, as shown in FIG. 3, if an ultra-high frequency wave flows through a choke wire 17 soldered by both its ends at 18 and 19, and if this choke wire 17 forms a hairpin having its two strands 17a and 17b substantially parallel to each other, a capacitive effect is created, shown in FIG. 3 by small capacitors 23, 24, 25 etc. However, this capacitive effect is not fixed and changes according to the frequency at which the transistor is used. Thus, the self-inductance presented by each of the wires 17 and 20 inside the transistor package is not fixed but decreases when the frequency increases. This makes it possible to broaden the frequency band in which the transistor has a sufficient gain and, more generally, this assembly not only matches the input and output impedances of the encapsulated transistor according to the invention, but also increases the gain.

An ultra-high frequency transistor chip, modified to obtain low noise and mounted in a package according to the invention, thus makes it possible to obtain:

a better noise factor since the chip has been matched for this purpose, an increase in gain by pre-matching the chip inside the package and not outside it, an increase in band width since those parts of the 50-ohm lines that connect the chip to the outside of the package are pre-matched by the choke wires 17 and 20.

FIGS. 4 and 5 show the improvements made by connecting a chip according to the invention. In FIG. 4, the curves represent the gain on 50 ohms and the noise factor NF also on 50 ohms, depending on the frequency in a 6 GHz to 18 GHz frequency range. The curve 26 shows that a MESFET transistor, pre-matched inside its package, has a gain ranging from 7 to 9.5 dB approximately between 6 and 18 GHz, while a transistor of the prior art, which is not pre-matched, has a gain which, according to the curve 27, drops from 7 to 3.5 dB approximately.

Simultaneously, and in the same frequency range, a transistor pre-matched according to the invention possesses, as shown by the curve 28, a noise factor which is substantially constant between 2.2 dB and 2.7 dB while a nonmatched transistor of the prior art has a noise factor which increases from 2.3 dB to almost 4dB. Looking at FIG. 5, if we now consider the gain associated with the minimum noise factor for each frequency, we note a difference in gain of about 2 dB throughout the 6 GHz to 18 GHz frequency range between a transistor pre-matched according to the invention, which has its gain curve associated with the noise factor shown at 30, and a prior art transistor which has its curve shown at 31.

The curves of FIGS. 4 and 5 pertain to a MESFET type ultra-high frequency transistor, more precisely to a transistor where the body of the chip is made homogeneously by layers of materials such GaAs, silicon being beyond the scope of the invention in the field of ultra-high frequency considered herein. In fact, the assembly according to the invention gives better pre-matching for transistors made with heterojunctions between AlGa As and GaAs, namely two-dimensional electron gas transistors such as TEGFETs, because the impedance of transistors of this type, at the minimum noise factor, is closer to 50 ohms for GaAs on AlGa As than for a MESFET on GaAs. This is because of the constitution of the material.

This improved pre-matching is shown in FIG. 6 which pertains to a TEGFET. The curve 33 gives the gain on an external impedance of 50 ohms between 6 and 18 GHz. The curve 34 gives the gain associated with the minimum noise factor, the curve 35 gives the noise factor on 50 ohms and the curve 36 gives the minimum noise factor. On the whole, it is seen that there is always an improvement of 1 to 2 dB in the gain or associated gain as compared with a MESFET, and a reduction of about 1 dB in the noise factor.

An improvement may be made in the invention by adding another pre-matching circuit inside the package, within the limits allowed by the dimensions of the internal cavity of a package. In this improvement, the transistor is matched close to the minimum noise factor, consequently in a narrower band such as 10.7 GHz to 12.5 GHz. This improvement can be easily made according to the electrical diagram of FIG. 7.

In this figure, the diagram of the basic invention as described up to now is represented by a transistor 9 with a source connected to the ground by a microstrip 16, a gate connected to an external impedance terminal 13 by a choke wire 17 connected between the terminal 18 of the transistor gate and a solder at end 19 of the impedance terminal 13, and a drain connected to an external impedance terminal 15 by means of a choke 20, connected between the drain terminal 21 and a solder end point 22 on the external impedance.

According to a first improvement in this invention, which makes it possible to reduce noise, a circuit comprising a choke wire 37 is series-mounted with a capacitor 38 between the solder at end 19 of gate external access connection 13 of and the ground. For example, the choke wire 37 may have a value of about 1 nH and the capacitor 38 may have a value of about 10 pF.

According to a second improvement which increases the gain of the transistor, a circuit, comprising a choke 39 series-mounted with a capacitor 40, is mounted symmetrically with respect to the previous circuit, between the solder end point 22 of external access connection 15 and the ground.

The making of this improvement in the invention is shown in FIG. 8 which repeats the essential elements of FIG. 2 but in which a capacitor chip 38 is fixed within the package on the metallic base 11, thus grounding an armature of the capacitor. A choke wire or microstrip 37, which goes round the gate choke wire or microstrip 17, is fixed between a solder point 41 on the external impedance terminal 13 and a solder point 42 on the upper surface of the capacitor 38.

The same assembly can be made on the drain of the transistor, but this question relates essentially to the geometry of the encapsulating package, which makes it possible to mount one or two circuits according to the invention depending on the place available.

FIG. 9 shows the associated gain curves and noise factor curves, according to frequency, for a TEGFET transistor encapsulated in a package and fitted with an internal matching device and with its improvement to enhance the noise factor, by means of a circuit comprising a choke 37 and a capacitor 38. The curve 43 shows the change in the gain associated with the minimum noise in the 10.7 GHz to 12.5 GHz frequency range, and it is seen that this curve is relatively flat between 11.7 and 12.5 dB, namely it is included in a range with a variation of 0.8 dB while the curve 43 gives the associated minimum gain, included in range of 0.25 dB, between 1.2 and 1.45 dB. As compared with the curves of FIG. 6, the difference at the minimum noise frequency is not very great, but in the frequency range for which the transistor has been given this improvement, the curves are flatter: this is a worthwhile feature for equipment manufactured with an amplifier encapsulated in a package, according to the invention, without external matching.

The invention can therefore be applied to transistors encapsulated in packages with internal cavities, used as ultra-high frequency amplifiers in all equipment such as telecommunications, radar or directional radio link equipment. The invention is specified in the following claims.

What is claimed is:

1. A low-noise, ultra-high frequency semiconductor device, comprising:
   a metallic base, said metallic base constituting a ground;
   a ceramic frame fixed to said metallic base;
   a transistor chip located inside said ceramic frame, said transistor chip having a gate, a drain, and a source, said source connected to said metallic base;
   a first external access connection having an end portion located inside said ceramic frame;
   a first choke wire serially connected to and located between said gate and said end portion of said first external access connection, said first choke wire having two strands which form a hairpin shape, said strands being substantially parallel.

2. A semiconductor device according to claim 1, further comprising:
   a second external access connection having an end portion located inside said ceramic frame;
   a second choke wire serially connected to and located between said drain and said end portion of said second external access connection, said second choke wire having two strands which form a hairpin shape, said two strands of said second choke wire being substantially parallel.

3. A semiconductor device according to claim 1, wherein:
   said first choke wire has an inductance which varies with a frequency used by said transistor chip.

4. A semiconductor device according to claim 2, wherein:
   said second choke wire has an inductance which varies with a frequency used by said transistor chip.

5. A semiconductor device according to claim 1, further comprising:
   a first capacitor, connected to said metallic base;
   a third choke wire, said third choke wire being serially connected to and located between said first capacitor and said end portion of said first external access connection.

6. A semiconductor device according to claim 2, further comprising:
   a second capacitor, connected to said metallic base;
   a fourth choke wire, said fourth choke wire being serially connected to and located between said second capacitor and said end portion of said second external access connection.

* * * * *